US010706950B1

(12) United States Patent
Gallagher et al.

(10) Patent No.: US 10,706,950 B1
(45) Date of Patent: Jul. 7, 2020

(54) TESTING FOR MEMORY ERROR CORRECTION CODE LOGIC

(71) Applicant: Cadence Design Systems, Inc., San Jose, CA (US)

(72) Inventors: Patrick Gallagher, Apalachin, NY (US); Steven Lee Gregor, Oswego, NY (US)

(73) Assignee: CADENCE DESIGN SYSTEMS, INC., San Jose, CA (US)

( * ) Notice: Subject to any disclaimer, the term of this patent is extended or adjusted under 35 U.S.C. 154(b) by 100 days.

(21) Appl. No.: 16/012,435

(22) Filed: Jun. 19, 2018

(51) Int. Cl.
  *G11C 29/00* (2006.01)
  *G11C 29/42* (2006.01)
  *G11C 29/46* (2006.01)
  *G11C 29/44* (2006.01)

(52) U.S. Cl.
  CPC .......... *G11C 29/42* (2013.01); *G11C 29/4401* (2013.01); *G11C 29/46* (2013.01); *G11C 2029/4402* (2013.01)

(58) Field of Classification Search
  CPC .... G11C 29/4401; G11C 29/46; H03M 13/47; G06F 11/28; G06F 11/2215; G06F 11/2284
  See application file for complete search history.

(56) References Cited

U.S. PATENT DOCUMENTS

| | | | | |
|---|---|---|---|---|
| 5,502,732 A | * | 3/1996 | Arroyo | G06F 11/2215 714/703 |
| 6,886,116 B1 | * | 4/2005 | MacLellan | G06F 11/2215 714/25 |
| 2004/0243887 A1 | * | 12/2004 | Sharma | H03M 13/47 714/52 |
| 2008/0301528 A1 | * | 12/2008 | Doi | G06F 11/2215 714/764 |
| 2009/0249148 A1 | * | 10/2009 | Ito | G06F 11/1008 714/746 |
| 2019/0088349 A1 | * | 3/2019 | Pyo | G06F 11/1044 |
| 2019/0268018 A1 | * | 8/2019 | Brueggen | H03M 13/015 |

* cited by examiner

*Primary Examiner* — Guerrier Merant
(74) *Attorney, Agent, or Firm* — Tarolli, Sundheim, Covell & Tummino LLP

(57) ABSTRACT

Systems and methods disclosed herein provide for improved testing of memory error correction code ("ECC") logic with memory built-in self-test ("MBIST"). Embodiments provide for a masking element to inject one or more faults into the ECC logic during at least one of a manufacturing test ("MFGT") and a power-on-self-test ("POST"), wherein, based on the injected faults, it can be determined if the ECC logic contains any errors.

20 Claims, 3 Drawing Sheets

System 100

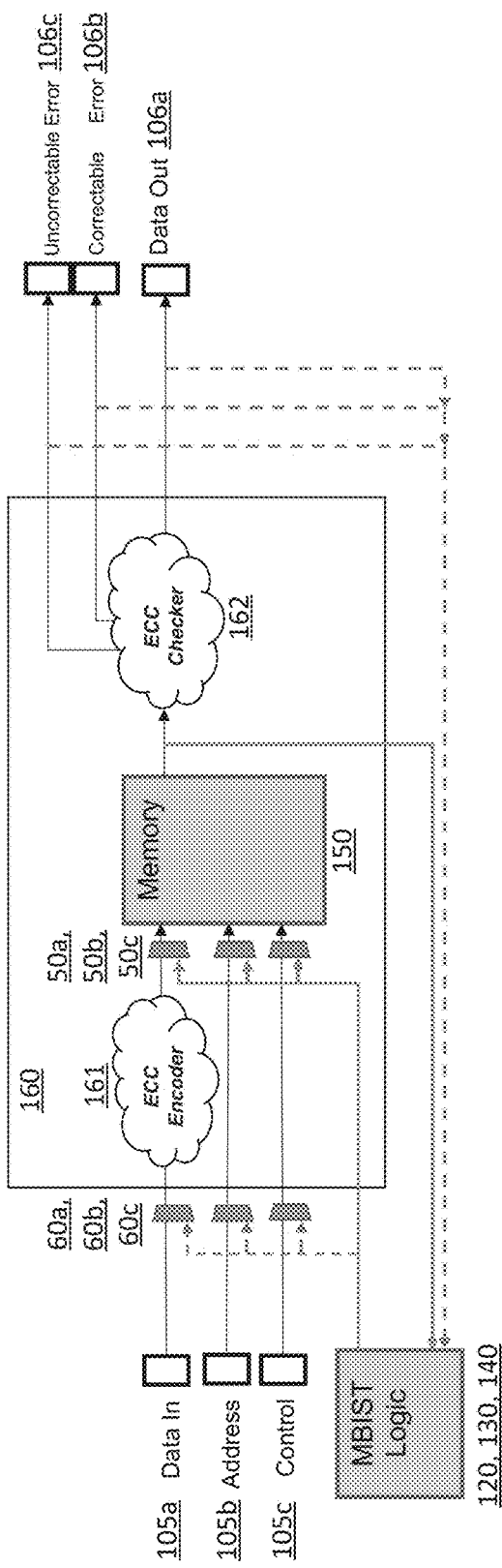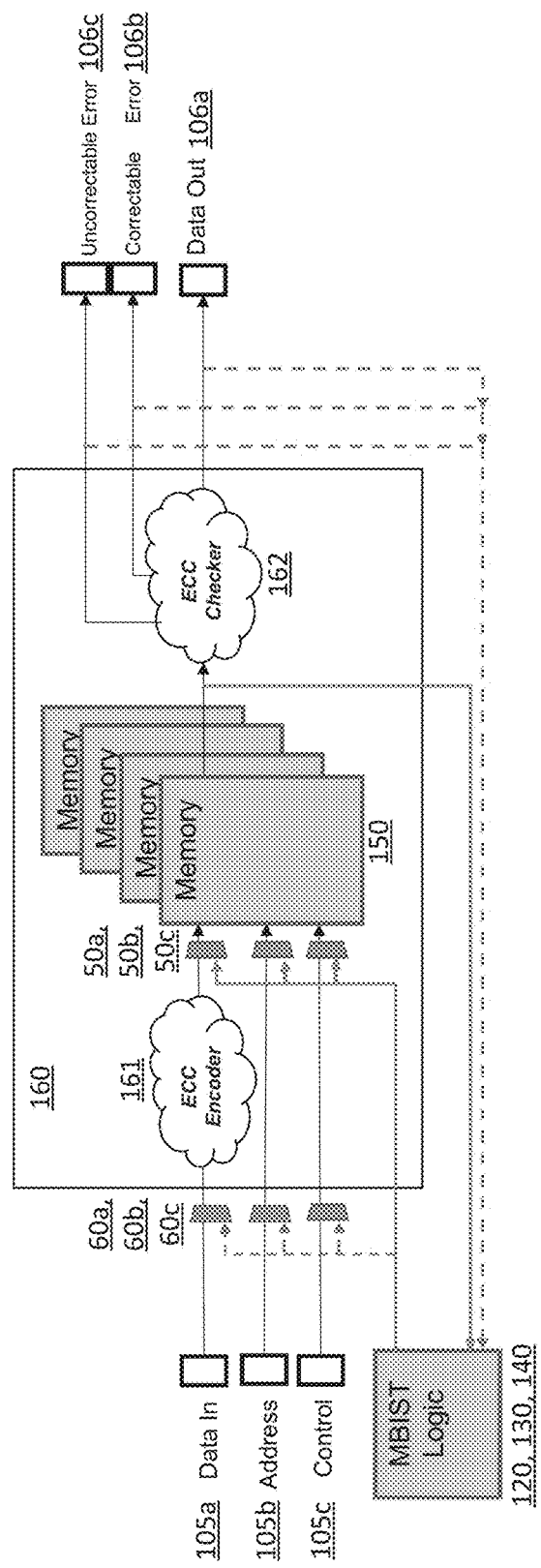

TESTING FOR MEMORY ERROR CORRECTION CODE LOGIC

TECHNICAL FIELD

The present application relates to an improved diagnostics system and method for testing memory error correction code logic with memory built-in self-test.

BACKGROUND

Testing can occur in three different phases of a system on a chip (SoC) life-cycle: a manufacturing test (MFGT), a power-on-self-test (POST), and a mission mode self-test (MMST). Each phase of the testing process carries its own requirements and goals.

In the first phase of testing, MFGT, the fabricated memories are tested with memory built-in-self-test (MBIST), in which the MBIST runs a series of data patterns, writes the data patterns into the memory array, and then reads the outputs from the memory array for comparison to expected data. Further, logic around the memories is tested using a scan test (e.g., automatic test pattern generation (ATPG)), functional patterns, or logic built-in-self-test (LBIST). The primary goal of MFGT is to assure that the highest level quality of silicon (QoS) is achieved. This can be achieved by, for example, stressing the SoC. However, even with the above testing strategies, certain failures can still escape test. For example, because (i) MBIST only tests between the MBIST engine and the MBIST comparator and (ii) ATPG is only tested up to (and from) the functional flops near the memory, the logic that feeds the memory arrays (or proceeds from them) that lies between the two testing strategies can be difficult to test. Error correction code (ECC) logic, is an example of such logic. ECC logic, which will be described in greater detail below, is the means for tolerating intermittent faults during the SoC's functional operation.

Conventional solutions to resolve the above testing exposure problem include: (i) ATPG RAM sequential (e.g., to push patterns through memories on functional paths), (ii) memories with embedded scan segments (e.g., scan chains) to test the functional paths, and (iii) have MBIST connect and control functional paths directly. However, ATPG RAM sequential can only be used in the MFGT phase but not the POST and MMST phases. Further, embedding scan segments to test the functional path increases the memory area. In addition, even though a test can be applied to the functional paths to and from the memory IP, internally, to the memory, that path is to scan flops and not truly the full functional path with its functional operation timing. Lastly, connecting MBIST to the functional paths to control them directly will likely impact function timing with additional multiplexing. Further, controlling the functional paths directly with MBIST is only beneficial if it is applied to the physical memory module. However, it is not as effective with logical memory modules, e.g., those including ECC logic.

The second phase of testing, POST, varies dependent on the technology node and market that the SoC is targeting. As its name implies, POST occurs when the SoC is activated prior to normal operations commencing, e.g., starting of a car. POST usually includes MBIST for testing the physical memory module and LBIST for testing the combinational logic within logical memory modules (ATPG testing can only be utilized for MFGT). Further, the test time limitation is more prominent in POST than MFGT. However, the test quality level for POST is not as stringent as MFGT because it is assumed that the SoC had been thoroughly tested at MFGT. As such, POST is more of a sign-off test from a functional point-of-view. Specifically, POST ensures that the SoC will operate as expected during functional operation until the next POST (e.g., the next time the car is started). However, POST also encounters some of the same problems that exist with MFGT, i.e., the inability to functionally test the ECC logic in the design. ECC logic is used for tolerating intermittent faults in the memories during the functional operation of the SoC. As such, if an error occurs in the ECC logic that masks a real failure, a system utilizing the SoC would be left unaware of the failure until it is too late. For safety-critical applications (e.g., automotive, pacemakers, etc.), such failures could prove deadly if not diagnosed early enough. Accordingly, the possibility of masked errors needs to be determined at least by POST so that the system is given enough time to respond prior to normal operations commencing.

In the third phase of testing, MMST, there are generally two approaches. In the first approach, partitions within the SoC design are scheduled to be taken off-line. Once offline, some level of testing (i.e., MBIST and/or LBIST) occurs on the partitions. However, if the test being applied to the data within the partition is destructive, additional overhead (i.e., memory area and time) will be required in order to save and restore the partition data as the partition comes off and on line. Further, because time is very critical during this phase, such overhead needs to be avoided as much as possible. In the second approach, dynamic-type testing, e.g., ECC, is employed. Unlike the first approach, the ECC testing is non-destructive to the SoC's data. Further, in terms of testing memory non-destructively, ECC is the primary means of testing during the MMST phase. As such, in order to assure a quality test during MMST, the ECC logic and the interfaces to and from the memories need to be tested. As mentioned previously above, standard test strategies like MBIST, ATPG, and LBIST can leave holes in the testing of logic around the memories. Therefore, if the ECC logic is not thoroughly tested during at least one of MFGT and POST, any errors that the ECC logic may contain could prevent proper error reporting during MMST.

Accordingly, there is a need to effectively test ECC logic and the interfaces to and from the memories during at least one of MFGT and POST.

BRIEF DESCRIPTION OF THE DRAWINGS

FIG. 2A illustrates another embodiment of the MBIST diagnostics system depicted in FIG. 1.

FIG. 2B illustrates an embodiment of the MBIST diagnostics system depicted in FIG. 2A including a plurality of memories.

DESCRIPTION OF EMBODIMENTS

The following description of embodiments provides non-limiting representative examples referencing numerals to particularly describe features and teachings of different aspects of the invention. The embodiments described should be recognized as capable of implementation separately, or in combination, with other embodiments from the description of the embodiments. A person of ordinary skill in the art reviewing the description of embodiments should be able to learn and understand the different described aspects of the invention. The description of embodiments should facilitate understanding of the invention to such an extent that other implementations, not specifically covered but within the knowledge of a person of skill in the art having read the description of embodiments, would be understood to be consistent with an application of the invention.

One aspect of the present disclosure is to provide MBIST diagnostic systems and methods for testing ECC logic during at least one of MFGT and POST. The systems and methods herein address at least one of the problems discussed above.

According to an embodiment, an MBIST diagnostics system includes: a memory, wherein the memory includes a physical memory module and a logical memory module; a masking element, wherein the masking element is configured to inject one or more faults into the logical memory module; and a data compare unit, wherein the data compare unit is configured to (i) receive at least one output from the logical memory module and (ii) determine if the logical memory module includes an error based on the received at least one output.

According to an embodiment, diagnostics method for MBIST includes: injecting, with a masking element, one or more faults into a logical memory module of a memory; generating, with the logical memory module, at least one output based on the injected one or more faults; receiving, with a data compare unit, the at least one output; and determining, with the data compare unit, if the logical memory module includes an error based on the received at least one output.

Figure 1:
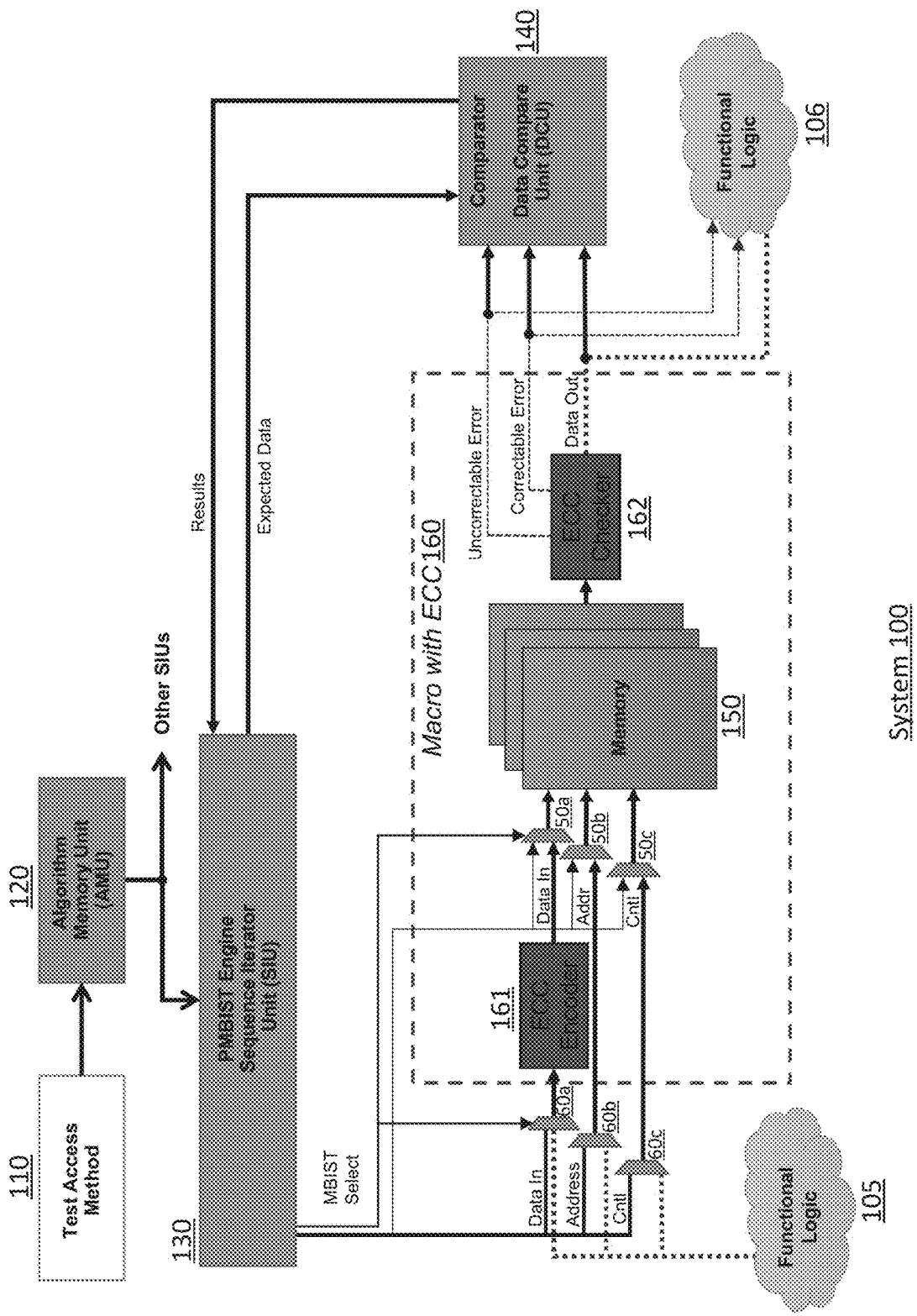
FIG. 1 illustrates an example embodiment of an MBIST diagnostics system.

FIG. 1 illustrates an example embodiment of an MBIST diagnostics system. As depicted in the figure, MBIST diagnostics system 100 includes a test access method ("TAM") 110, algorithm memory unit ("AMU") 120, sequence iterator unit ("SIU") ("engine") 130, data compare unit ("DCU") ("comparator") 140, memories 150, and macro 160. In an embodiment, the system 100 can also include a plurality of other SIUs 130. In an embodiment, each SIU 130 can interact with one or more memories 150 and associated DCUs 140.

In an embodiment, the TAM 110 is a means of communicating from outside the chip. In an embodiment, the TAM 110 can be implemented through either a "Joint Test Action Group" ("JTAG") or "Direct Access" interface. In an embodiment, the JTAG interface includes a plurality of pins (e.g., four or five pins) that are utilized to extract test information during the memory test. In an embodiment, the "Direct Access" interface corresponds to a different set of pins that doesn't require quite the complexity of the JTAG interface. For example, the "Direct Access" interface only requires a set of two pins. Further, because the "Direct Access" pins can be shared with some other ports, no additional overhead is required. Therefore, in an embodiment, the "Direct Access" interface can internally mimic the behavior of JTAG macros but, instead, with minimum area requirements. In an embodiment, the AMU 120 contains the programs (e.g., algorithms) that run in the MBIST logic against the memory 150. In an embodiment, the AMU 120 distributes the above program information into the SIU 130. Specifically, a program previously-loaded onto the AMU 120 is distributed one line at a time to the SIU 130.

In an embodiment, the SIU 130 can be utilized to test a physical view of the memories 150 or a logical view of the memories 150, i.e., the macro 160. In an embodiment, the physical view of the memories 150 includes the memories 150. On the other hand, the macro 160 includes the memories 150 as well as additional logic, e.g., ECC logic. In an embodiment, the ECC logic of the macro 160 includes an ECC encoder 161 and an ECC checker 162. In some embodiments, the ECC encoder 161 and the ECC checker 162 are included in a single logical arrangement that interacts with the memories 150. In an embodiment, the logical memory corresponds to data before applying the ECC encoder 161 and after applying the ECC checker 162. As such, the physical memory (e.g., memories 150), which takes into consideration bits added by the ECC encoder 161, may be wider than the logical memory. For example, the logical memory before the ECC encoder 161 and after the ECC checker 162 may be 32 bits wide while the width of the physical memories 150 may be 39 bits. Similar to the inputs for the physical view, the inputs to the macro 160 include at least a data input Data In (e.g., to the ECC encoder 161), an address input Address to the memories 150, and a control input Ctrl to the memories 150. The outputs from the macro 160 include at least a data output Out from the ECC checker 162, error indicator Uncorrectable Error from the ECC checker 162, and error indicator Correctable Error from the ECC checker 162. In an embodiment, the SIU 130 selects one of the physical or logical (i.e., the macro 160) views of the memories 150 to test via a selection signal MBIST Select. For example, the physical view of the memories 150 is tested if the MBIST Select signal is "0" and the macro 160 is tested if the MBIST Select signal is "1." In an another embodiment, the physical view of the memories 150 is tested if the MBIST Select signal is "1" and the macro 160 is tested if the MBIST Select signal is "0."

In an embodiment, if the physical view of the memories 150 is selected, the SIU 130 generates command and address sequence of the data that gets presented to the memories 150 (e.g., via data input Data in, address input Addr, and control input Ctrl) when (i) data is being written onto the memories 150, (ii) data is being presented for comparison, and (iii) the memories 150 are being read. In an embodiment, the address data received at Addr refers to the location in the memories 150 at which the next word, or string of data bits, received at the Data In is to be accessed for one of storage or retrieval. Further, the control data received at Ctrl could provide a variety of different information. In some embodiments, the control data enables the memories 150 for data storage. In some embodiments, the control data is a clock signal, which provides the memories 150 with the ability to synchronize data storage on a virtual memory stack. In some embodiments, the control data indicates whether the memories 150 are receiving data upon a latch according to a write operation. In some embodiments, the control data indicates whether the memories 150 are transmitting data upon a latching according to a read operation. In some embodiments, several different types of control data are provided on a plurality of control inputs available on the memories 150.

In an embodiment, each SIU 130 feeds both (i) the command and address sequence into the memories 150 and (ii) expected data into a first input of the DCU 140. Then, based on the command and address sequence fed into the memories 150, the memories 150 generate outputs, which are received by another input of the corresponding DCUs 140. In an embodiment, the DCU 140 compares the expected data from the SIU 130 with the output from the memories 150. In an embodiment, the expected data from the SIU 130 is received by the DCU 140 at the same time as the output from the memories 150. In an embodiment, based on the comparison, the DCU 140 is then able to determine if the memories 150 include any failing data bits. For example, if the DCU 140 determines that the expected values are equivalent to the output from the memories 150, then it is likely that the associated data bits are functioning properly. However, if the DCU 140 detects any mis-compares, then it is likely that the associated data bits are not functioning properly, i.e., failing. After the comparison, the DCU 140 transmits the result of the comparison, i.e., working or failing, to the SIU 130 for further processing. In an embodiment, a working bit may be associated with a logical value of "0," while a failing bit may be associated with a logical value of "1."

On the other hand, if the logical view of the memories 150 is selected for testing, the SIU 130 provides the command and address sequence of the data to the macro 160. In an embodiment, the ECC encoder 161 manipulates the data provided by the Data In. The data manipulation performed by the ECC encoder 161 can in some embodiments involve concatenating at least one additional bit to the originally provided bit string. The at least one additional bit string is generated and attached to the original bit string by the ECC encoder 161 in order to provide a check-bit. A check-bit may alternatively be referred to, in some embodiments, as a parity bit. The addition of this information enables the ECC logic to, at a later point in time, determine whether the code includes errors. Generally, the check bit is added to the end (e.g., after the last bit in the transmission line) of the original bit string. In some embodiments, the check bit is provided at the first end of the original bit string, and in some embodiments, the check bit is inserted between bits in the original bit string. Further, similar to the physical view of the memories, (i) the address data received at Address refers to the location in the memories 150 at which the next word, or string of data bits, received at the Data In is to be accessed for one of storage or retrieval and (ii) the control data received at Ctrl could provide a variety of different information. Further, in an embodiment, data provided from the memories 150 are received by the ECC checker 162. The ECC checker 162 analyzes the output from the physical memory (i.e., memories 150), including the concatenated bits. In an embodiment, the ECC checker 162 removes the concatenated bits. Then, the ECC checker 162 includes logic that modifies the string of bits, as necessary, based on any errors that were reported from the data included in the check-bits to correct any faults. The corrected data is provided at the data output Out of the ECC checker 162.

Further, depending on the type of error, single-bit or multi-bit, the ECC checker 162 can also output an error indication. In an embodiment, the ECC checker 162 may be a single-bit correct, multi-bit detect. In other words, the ECC checker 162 may detect and correct single-bit failures but is only able to detect multi-bit failures. For example, if there was a single bit of error that was then corrected by the ECC checker 162, the Correctable Error indicator will be activated, e.g., output a value of "1." However, if multiple bits are corrupted and the ECC checker 162 can't correct the errors, the Uncorrectable Error indicator will be activated, e.g., output a value of "1." In another embodiment, the ECC checker may be an N-bit correct, M-bit detect, where M is an integer greater than N. On the other hand, if there were no errors in the data string according to the check bit data, then the bit string minus the concatenated bits is provided at the output of the ECC checker 162. In this case, both of the Correctable Error indicator and the Uncorrectable Error indicator will output a value of "0." Further, as depicted in the figure, the outputs from the macro 160, i.e., Data Out, Correctable Error, and Uncorrectable Error, are provided to the DCU 140 to be compared with expected values of the Data Out, Correctable Error, and Uncorrectable Error. As such, based on the comparison, it can be determined if the logical memory includes any failures.

Further, in an embodiment, the system 100 also includes functional logic 105 and 106, physical module multiplexers 50a to 50c, and logical module multiplexers 60a to 60c. In an embodiment, the physical module multiplexers 50a to 50c are used to control the flow of data (e.g., Data In, Addr, Ctrl) into the memories 150 and the logical module multiplexers 60a to 60c are used to control the flow of data (e.g., Data In, Address, Ctrl) into the macro 160. As such, if the physical view of the memories 150 is selected for testing, the physical module multiplexers 50a to 50c will be activated (e.g., via the MBIST Select signal) while the logical module multiplexers 60a to 60c will remain deactivated. On the other hand, if the logical view of the memories 150 is selected for testing, the logical module multiplexers 60a to 60c will be activated (e.g., via the MBIST Select signal) while the physical module multiplexers 50a to 50c will remain deactivated. In an embodiment, the physical module multiplexers 50a to 50c and the logical module multiplexers 60a to 60c allow data to be fed into the memories 150 from either the SIU 130 or via the regular functional (i.e., non-test mode) path, e.g., the functional logic 105. Similarly, on the output side of the memory, the output (e.g., Data Out, Correctable Error, and Uncorrectable Error) may be provided to the DCU 140 for comparison purposes or through the regular functional path e.g., functional logic 106.

FIG. 2A illustrates another embodiment of the MBIST diagnostics system depicted in FIG. 1. Specifically, FIG. 2A depicts the system 100 of FIG. 1 with a single memory 150. Further, the figure also depicts the inputs and outputs associated with the functional logic 105 and 106 in FIG. 1. For example, input 105a corresponds to the Data In, input 105b corresponds to the Address, and input 105c corresponds to the Control. Further, output 106a corresponds the Data Out, output 106b corresponds to the Correctable Error, and output 106c corresponds to the Uncorrectable Error. In an embodiment, the inputs 105a to 105c and the outputs 106a to 106c are utilized during the functional (i.e., non-test) mode of the memory 150. Further, as described above, during test mode, the MBIST logic (i.e., AMU 120, SIU 130, and DCU 140) can be utilized to test either the memory 150 (i.e., physical memory) or the macro 160 (i.e., logical memory). For example, the solid lines to and from the MBIST logic correspond to the physical memory test while the dashed lines correspond to the logical memory test.

FIG. 2B illustrates an embodiment of the MBIST diagnostics system depicted in FIG. 2A including a plurality of memories.

Figure 3:
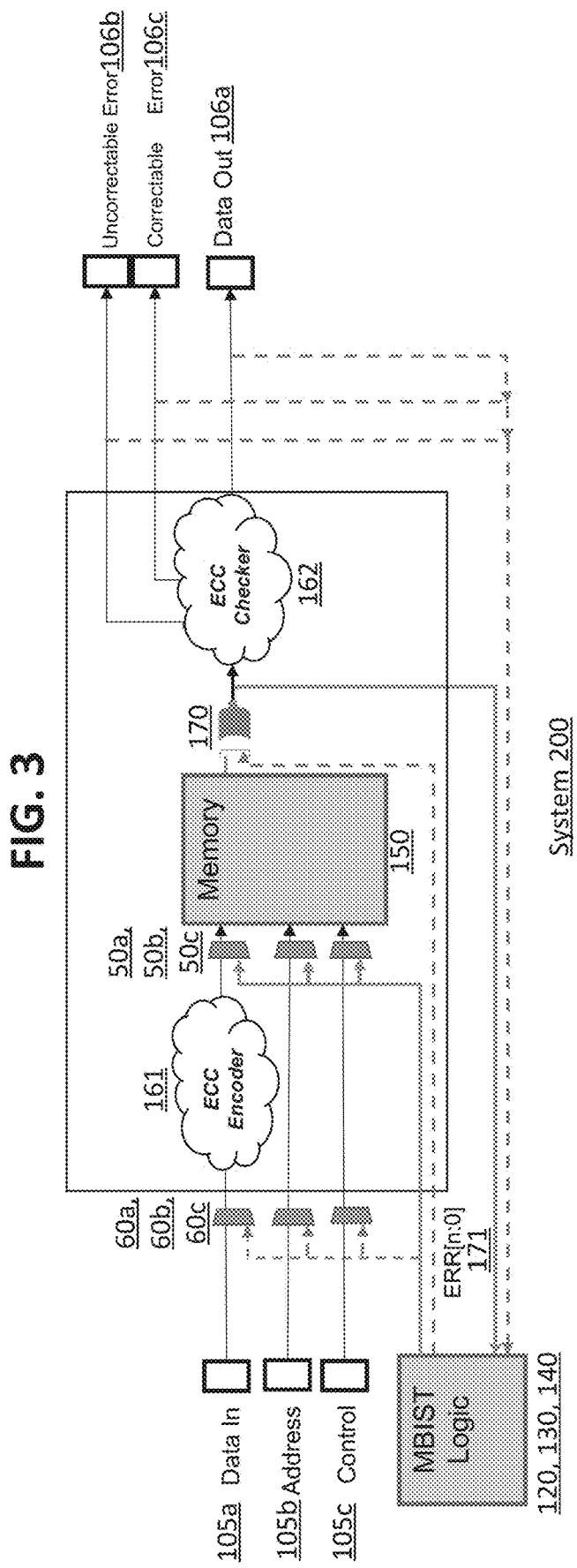
FIG. 3 illustrates an MBIST diagnostics system in accordance with an example embodiment of the present invention.

FIG. 3 illustrates an MBIST diagnostics system in accordance with an example embodiment of the present invention. In an embodiment, MBIST diagnostic system 200 includes all of the same components as the system 100 and also includes a masking element 170. In an embodiment, the masking element 170 is utilized to test the ECC logic itself. For example, as depicted in the figure, the masking element 170 can be utilized to inject faults into the ECC checker 162 in order to test its response to the injected faults. Specifically, the masking element 170 can mask the output of the memory 150 before it's provided to the ECC checker 162. As such, by intentionally providing the ECC checker 162 with faulty input, it can be determined if the Correctable Error indicator and the Uncorrectable Indicator are properly working.

In an embodiment, the masking element 170 is able to mask the output of the memory 150 by combining the output with values provided by an error bus 171. In an embodiment, the width of the error bus 171 is equal to the width of the memory 150. As such, the masking element 170 can mask one or more of the bits along a width of the memory 150. In an embodiment, the masked data bits can be the ECC data bits or check bits. In an embodiment, the "masking" bit values in the error bus 171 are dependent on the combinational logic associated with the masking element 170. For example, in an embodiment, the masking element 170 may be an exclusive NOR ("XNOR") logic gate. In an embodiment, the XNOR logic gate may receive the output of the memory 150 at a first input and the bit values from the error bus 171 at a second input. As such, if the second input of the XNOR logic gate is equal to "1," then the output of the XNOR logic gate will be equivalent to the value of the first input. However, if the second input of the XNOR logic gate is equal to "0," then the output of the XNOR logic gate will be a complement of the value of the first input. In other words, the error bus 171 can mask a particular output of the memory 150 by applying a "0" in the corresponding bit position of the error bus 171. However, in other embodiments, the masking element 170 may include other combinational logic and, therefore, the "masking" value in the error bus 171 may be different, e.g. "1.", In an embodiment, the values in error bus 171 may be provided in a test plan used to test the logical memory, i.e., the macro 160. In an embodiment, the test plan includes a set of one or more algorithms as well as a set of test conditions associated with the algorithms. In an embodiment, the algorithms can either be hardwired-in or programmed. In an embodiment, hardwired algorithms are compiled in the MBIST hardware and, therefore, are embedded in the hardware itself. Accordingly, once they're built, they cannot be changed. Further, although programmed algorithms are not compiled in MBIST hardware, they do require additional logic or JTAG controls. Further, the programmable algorithms are programmable (e.g., modifiable) based on the limits defined by either software or a user, e.g., a chip designer. In an embodiment, the test conditions may include the address order (e.g., fast column, fast row, or fast diagonal), the address update (e.g., linear or complement), the data background, and the sequence iterator. In an embodiment, the test plan may also include expected values of the Data Out, the Correctable Error indicator, and the Uncorrectable Error indicator associated with the values of the error bus 171.

As mentioned before, the ECC checker 162 provides the Data Out, Correctable Error, and Uncorrectable Error to the DCU 140. Therefore, after one or more faults are injected into the ECC checker 162, it can be determined if the ECC logic is properly working based on the comparison of the actual and expected values of the Data Out, Correctable Error, and Uncorrectable Error. For example, assuming the ECC checker is a single-bit correct, multi-bit detect, if only a single fault is injected (e.g., the error bus 171 includes a "0" in the masking bit position) and the ECC checker 162 corrects the error, then (i) the Correctable Error indicator would be activated (i.e., output a value of "1"), (ii) the Correctable Error indicator value would be sampled by the DCU 140, and (iii) the DCU 140 would compare the sampled Correctable Error indicator value with an expected Correctable Error indicator value. In an embodiment, the test plan assumes that the ECC checker 162 is properly working and, therefore, the expected Correctable Error indicator is equal to "1." As such, after the sampled Correctable Error indicator value is compared with the expected Correctable Error indicator value, it can be confirmed that the Correct-able Error indicator is properly working. However, if after the single fault is injected, the ECC checker 162 does not correct the fault, then the Correctable Error indicator would remain deactivated (i.e., output a value of "0") and, accordingly, the DCU 140 would detect a mis-compare between the sampled Correctable Error indicator value and the expected Correctable Error indicator value. In other words, the DCU 140 can indicate that the ECC checker 162 and, therefore, the ECC logic is not properly working.

Similarly, if multiple faults (e.g., the error bus 171 includes multiple "Os" in corresponding masking bit positions) are injected and the ECC checker 162 fails to correct the faults, then (i) the Uncorrectable Error indicator would be activated (i.e., output a value of "1"), (ii) the Uncorrectable Error indicator value would be sampled by the DCU 140, and (iii) the DCU 140 would compare the sampled Uncorrectable Error indicator value with an expected Uncorrectable Error indicator value. In an embodiment, as with the Correctable Error indicator, the test plan assumes that the ECC checker 162 is properly working and, therefore, the expected Uncorrectable Error indicator is equal to "1." As such, after the sampled Uncorrectable Error indicator value is compared with the expected Uncorrectable Error indicator value, it can be confirmed that the Uncorrectable Error indicator is properly working. However, if after the multiple faults are injected, the ECC checker 162 corrects the fault, then the Uncorrectable Error indicator would remain deactivated (i.e., output a value of "0") and, accordingly, the DCU 140 would detect a mis-compare between the sampled Uncorrectable Error indicator value and the expected Uncorrectable Error indicator value. In other words, the DCU 140 can indicate that the ECC checker 162 and, therefore, the ECC logic is not properly working. As such, by testing whether the Correctable Error indicator and the Uncorrectable Error indicator are functioning properly, it can be determined if the ECC logic is operating properly before normal operations of the SoC commence.

In another embodiment, the faults may be injected into the ECC encoder 161 instead of (or in addition to) the ECC checker 162. For example, the faults may be injected into the ECC encoder 161 as the ECC encoder 161 receives the data provided by the Data In from the SIU 130.

In an embodiment, the fault injection may be provided during testing of the logical view of the memories 150. Further, to thoroughly test the ECC logic, the fault injection may be provided after first testing (e.g., during a first pass) the ECC logic with no fault injections. In other words, the error bus 171 would not include any "Os." In an embodiment, by testing the ECC logic without any fault injections, it can be determined if the Correctable Error and Uncorrectable Error indicators remain off when they need to be. Then, during a second pass, the ECC logic may be tested with a single fault injection. In other words, the error bus 171 includes a "0" in one of the bit positions. As discussed above, with the single fault injection, it can be determined if the Correctable Error indicator is working. Then, during a third pass, the ECC logic may be tested through a combination of multiple fault injections (e.g., the error bus 171 includes "Os" in multiple bit positions) in order to determine if the Uncorrectable Error indicator is working properly.

In an embodiment, the sequential fault injection method discussed above may be performed during POST. In another embodiment, the sequential fault injection method may also be performed during MFGT. As such, because the ECC logic is thoroughly tested during one of the MFGT and POST tests, the correctness of the ECC logic can be determined before normal operations commence. Accordingly, a quality test utilizing the ECC logic during MMST can be assured for safety-critical applications.

In another embodiment, the system 200 may include a plurality of memories 150 and corresponding masking elements 170. Further, in an embodiment, the plurality of memories 150 and the corresponding masking elements 170 interact such that multiple memories 150 can be tested concurrently.

In the foregoing Description of Embodiments, various features may be grouped together in a single embodiment for purposes of streamlining the disclosure. This method of disclosure is not to be interpreted as reflecting an intention that the claims require more features than are expressly recited in each claim. Rather, as the following claims reflect, inventive aspects lie in less than all features of a single foregoing disclosed embodiment. Thus, the following claims are hereby incorporated into this Description of Embodiments, with each claim standing on its own as a separate embodiment of the invention.

Moreover, it will be apparent to those skilled in the art from consideration of the specification and practice of the present disclosure that various modifications and variations can be made to the disclosed systems without departing from the scope of the disclosure, as claimed. Thus, it is intended that the specification and examples be considered as exemplary only, with a true scope of the present disclosure being indicated by the following claims and their equivalents.

The invention claimed is:

1. A memory built-in self-test ("MBIST") diagnostics system, comprising;
   a memory, wherein the memory includes a physical memory module and a logical memory module, wherein the logical memory module includes error correction code ("ECC") logic further comprising:
      an ECC encoder that receives a first set of data, manipulates the first set of data, and provides the manipulated first set of data to the physical memory module, and
      an ECC checker that receives a second set of data from a masking element, manipulates the second set of data and outputs the manipulated second set of data;
   a sequence iterator unit ("SIU") that is configurable to provide the first set of data to the ECC encoder, wherein one or more faults are injected into the first set of data received by the ECC encoder;
   wherein the masking element is configurable to receive the manipulated first set of data from the physical memory module and inject one or more faults into the manipulated first set of data to generate the second set of data received by the ECC checker; and
   a data compare unit, wherein the data compare unit is configured to (i) receive the manipulated second set of data from the ECC checker and (ii) determine if the logical memory module includes an error by comparing the manipulated second set of data from the ECC checker and a set of expected data provided by the SIU.

2. The diagnostics system of claim 1, wherein the ECC checker generates the manipulated second set of data in response to the injection of the one or more faults, wherein the manipulated second set of data includes at least one of a correctable error indicator and an uncorrectable error indicator.

3. The diagnostics system of claim 1, wherein the masking element (i) masks one or more data bits output from the physical module and (ii) injects the masked one or more data bits into the logical memory module as the one or more faults.

4. The diagnostics system of claim 3, wherein the masking element receives (i) the one or more data bits from the physical memory module at a first input and (ii) one or more masking data bits from an error bus, wherein the one or more masking data bits from the error bus mask the one or more data bits from the physical memory module based on combinational logic associated with the masking element.

5. The diagnostics system of claim 4, wherein the masking element is an exclusive NOR ("XNOR") logic gate.

6. The diagnostics system of claim 1, wherein the one or more faults are injected during a test of the logical memory module.

7. The diagnostics system of claim 6, wherein (i) during a first pass of the test, no faults are injected into the logical memory module, (ii) during a second pass of the test, one fault is injected into the ECC checker of the logical memory module, and (iii) during a third pass of the test, a plurality of faults are injected into the logical memory module.

8. The diagnostics system of claim 7, wherein the physical memory module is tested before the test of the logical memory module.

9. The diagnostics system of claim 6, wherein (i) during a first pass of the test, no faults are injected into the first set of data or the manipulated first set of data, (ii) during a second pass of the test, one fault is injected into the first set of data, (iii) during a third pass of the test, one fault is injected into the manipulated first set of data and (iv) during a fourth pass of the test, one fault is injected into the first set of data and another fault is injected into the manipulated first set of data.

10. The diagnostics system of claim 1, wherein the one or more faults are injected into the logical memory module during a manufacturing test ("MFGT").

11. The diagnostics system of claim 1, wherein the memory is one of a plurality of memories, such that the diagnostics system includes a masking element for each respective memory of the plurality memories.

12. The diagnostics system of claim 1, wherein the SIU is further configured to receive and process data that characterizes the determination made by the data compare unit.

13. A diagnostics method for memory built-in self-test ("MBIST"), the method comprising:
   providing, with a sequence iterator unit ("SIU"), a first set of data, wherein one or more faults are injected into the first set of data;
   manipulating, with an error correction code ("ECC") encoder of a logical memory module, the first set of data;
   injecting, with a masking element, one or more faults into the manipulated first set of data received, wherein the masking element generates a second set of data to be received by an ECC checker of the logical memory module;
   generating, with the ECC checker of the logical memory module, a manipulated second set of data based on the injected one or more faults;
   receiving, with a data compare unit, the the manipulated second set of data from the ECC checker and a set of expected data from the SIU; and
   determining, with the data compare unit, if the logical memory module includes an error by comparing the manipulated second set of data the expected set of data.

14. The diagnostics method of claim 13, wherein the logical memory module includes ECC logic, wherein the ECC logic includes the ECC encoder and the ECC checker.

15. The diagnostics method of claim 14, wherein the manipulated second set of data includes at least one of a correctable error indicator and an uncorrectable error indicator.

16. The diagnostics method of claim 13, wherein the masking element (i) masks one or more data bits of the manipulated first set of data output from a physical memory module and (ii) injects the masked one or more data bits into the manipulated first set of that to generate the second set of data input into the ECC checker of the logical memory module as the one or more faults.

17. The diagnostics method of claim 16, wherein the masking element receives (i) the one or more data bits of the manipulated first set of data from a physical memory module at a first input and (ii) one or more masking data bits from an error bus, wherein the one or more masking data bits from the error bus mask the one or more data bits from the physical memory module based on a combinational logic associated with the masking element.

18. The diagnostics system of claim 13, wherein the one or more faults are injected during a test of the logical memory module, wherein (i) during a first pass of the test, no faults are injected into the first set of data or the manipulated first set of data, (ii) during a second pass of the test, one fault is injected into the first set of data or the manipulated first set of data, and (iii) during a third pass of the test, a plurality of faults are injected into the first set of data or the manipulated first set of data.

19. The diagnostics method of claim 18, wherein the physical memory module is tested before the test of the logical memory module.

20. The diagnostics method of claim 13, wherein the one or more faults are injected into the logical memory module during a manufacturing test ("MFGT").

\* \* \* \* \*